United States Patent [19]

Koseki et al.

[11] Patent Number: 5,639,693

[45] Date of Patent: Jun. 17, 1997

[54] SEMICONDUCTOR DEVICE AND PROCESS FOR FABRICATING THE SAME

[75] Inventors: Osamu Koseki; Takichi Ishii; Masaaki Mandai; Tomoyuki Yoshino; Hitoshi Takeuchi, all of Chiba, Japan

[73] Assignee: Seiko Instruments Inc., Japan

[21] Appl. No.: 347,864

[22] Filed: Dec. 1, 1994

[51] Int. Cl.$^6$ .................................................... H01L 21/60
[52] U.S. Cl. .......................... 437/209; 437/211; 437/214; 437/217; 437/218
[58] Field of Search ...................... 437/209, 211, 437/214, 215, 217, 218, 219, 220; 257/723, 773

[56] References Cited

U.S. PATENT DOCUMENTS

| | | | |
|---|---|---|---|
| 5,091,769 | 2/1992 | Eichelberger | 257/723 |
| 5,315,486 | 5/1994 | Fillion et al. | 257/723 |
| 5,353,498 | 10/1994 | Fillion et al. | 437/209 |
| 5,442,236 | 8/1995 | Fukazawa | 257/773 |

*Primary Examiner*—Kevin Picardat
*Attorney, Agent, or Firm*—Adams & Wilks

[57] ABSTRACT

A process for fabricating a semiconductor device which permits the placement of plural semiconductor chip devices at a reduced pitch comprises the steps of bonding a plurality of semiconductor chip devices to a substrate, forming a conductive thin film on the substrate to cover at least connecting regions of the semiconductor chip devices, and patterning the conductive thin film using an excimer laser to form interconnections between the respective semiconductor chip devices. The conductive thin film is formed by a method selected from physical vapor deposition and chemical vapor deposition. The step of bonding the semiconductor chip devices to a substrate is preferably performed using an epoxy-based adhesive. Preferably, an insulating film is formed on the plural semiconductor chip devices in regions except for the connection regions. Patterning of the conductive thin film is performed using an excimer laser beam emitted in two pulses at an output energy of 300 mJ/cm$^2$.

20 Claims, 6 Drawing Sheets

SEMICONDUCTOR DEVICE AND PROCESS FOR FABRICATING THE SAME

BACKGROUND OF THE INVENTION

1. Field of the Invention

The present invention relates to a semiconductor device which comprises a plurality of semiconductor elements, such as computers, semiconductor image sensors, etc., and a process for fabricating the same.

2. Description of the Related Art

Examples of the known technology for this field include the methods illustrated in FIGS. 8 to 10. Referring to a prior art device illustrated in FIG. 8, a plurality of semiconductor chips 1 are adhered and fixed on a single alumina substrate 2, and the plurality of semiconductor chips 1 are electrically connected one another by gold-wire bonding 18 between the pads 5 on the semiconductor chips 1 and the copper interconnection 6 on the alumina substrate 2. According to another prior art technology with reference to FIG. 9, the active plane of the semiconductor chip 1 having a solder bump 19 previously formed thereon is opposed to the alumina substrate 2 having thereon a copper interconnection 6, and the plane is heated to about 220° C. to melt and adhere the copper interconnection 6 to the solder bump 19. In this manner, the desired electrodes of the plurality of semiconductor chips 1 are electrically connected to obtain the semiconductor device. In another prior art device with reference to FIG. 10, a semiconductor chip 1 having thereon a gold bump 21 is opposed to a tin lead 20 being adhered to a polyimide film 13, and is heated together with the polyimide film to about 400° C. to eutectically join the gold bump 21 on the semiconductor chip 1 with the tin lead. Thus, a plurality of semiconductor chips 1 have been electrically connected by any of the aforementioned processes.

The prior art processes described above are provided for electrically connecting a plurality of semiconductor chips to one another, however, following problems were found yet to be unsolved. In the method of wire bonding the plurality of semiconductor elements with reference to FIG. 8, the use of a wire bonding machine creates several problems. Due to the limitations of the wire bonding machine, a long distance w is necessary for drawing the wire. Thus, at least a distance of 2 w is necessary between two adjacent semiconductor elements, and, moreover, a height of h is required for drawing out the wire. Consequently, the semiconductor device composed of a plurality of semiconductor elements becomes voluminous and thick. Furthermore, since about 0.25 seconds per wire is necessary for the connection, the total process consumes considerable time. This leads to the increase in production cost. Referring to the process comprising connecting a plurality of semiconductor elements via the solder bumps with reference to FIG. 9, the elements are pulled and connected one another by the surface tension of the solder. With increasing size of the semiconductor element, however, warping and thermal deformation occur on the semiconductor elements to generate bumps which cannot be brought into contact with the neighboring bumps. Another prior art process with reference to FIG. 10 is unfeasible to connect the semiconductor elements having a large number of pads, because the capacity of producing the leads is limited to about 400 pins. Moreover, none of the aforementioned processes with reference to FIGS. 8, 9, and 10 can achieve the connection of semiconductor elements having a pitch between pads as short as about 0.1 mm or even narrower.

SUMMARY OF THE INVENTION

The present invention aims to solve the aforementioned problems by a process for fabricating a semiconductor device, which comprises mechanically joining a semiconductor element to an alumina substrate or a polyimide film by adhesion fixing or by using a joint chip, and then electrically connecting the semiconductor elements by forming an electrically conductive coating by means of PVD or CVD on the periphery of the joining portion between the semiconductor elements and patterning the resulting coating as desired by using a processing apparatus such as an excimer laser.

The process according to the present invention as described above implements connection in an extremely small area because it does not need a long distance or height as required in case of effecting wire bonding. Thus, the process enables the fabrication of a compact and thin semiconductor device. Moreover, since the process obviates the need of connecting wires one by one, the connection process consumes less time. This enables the fabrication of semiconductor devices at a low cost. The present process also enables the fabrication of large area semiconductor devices because it can be conducted without any limitations concerning the problems of warping and deformation which affect the process in case of using solder bumps. It is also possible to connect semiconductor elements comprising a considerable number of pads. The use of a processing machine such as an excimer laser in patterning allows connection of very narrowly pitched semiconductor elements, because an excimer laser enables patterning to a pitch as fine as about 0.02 mm. The use of such a processing machine also results in the fabrication of low-cost semiconductor devices, because it allows the fabrication of compact and thin semiconductor devices.

DESCRIPTION OF THE PREFERRED EMBODIMENTS

Referring to the attached drawings, examples according to the present invention are described below.

Figure 1:
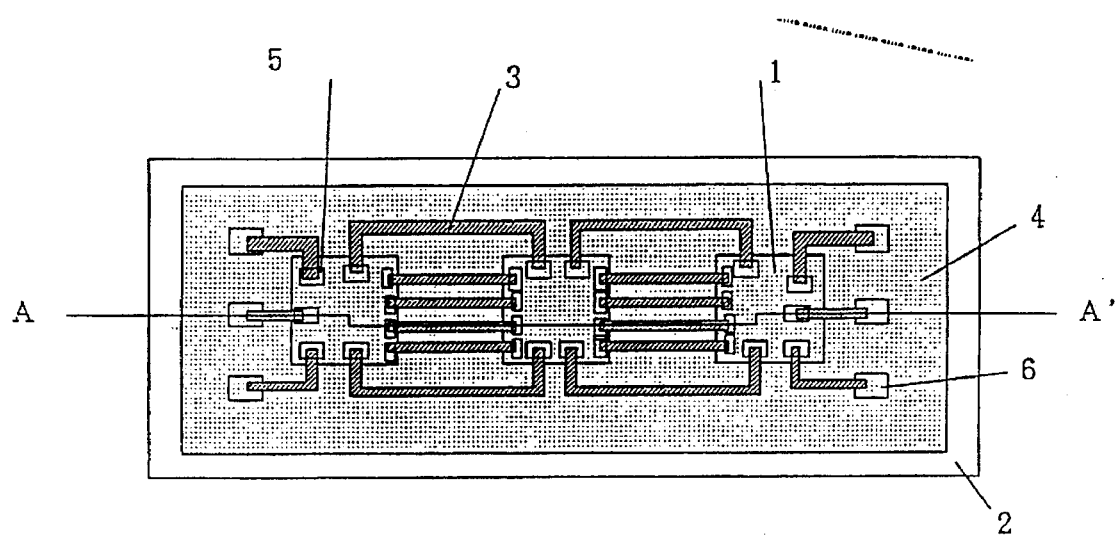
FIG. 1 is an upper view of a semiconductor device according to the present invention.
Figure 2:
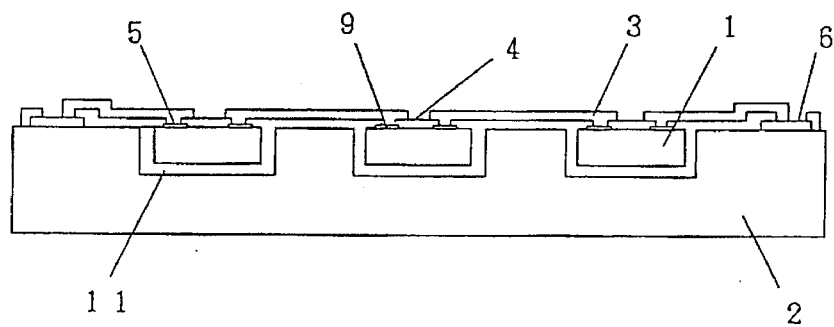
FIG. 2 is a cross section view along line A—A' of a semiconductor device according to the present invention.

FIG. 1 is the upper view of the semiconductor device of an example according to the present invention. FIG. 2 is the cross section view along line A—A' of the semiconductor device of an example according to the present invention. A semiconductor chip 1 is adhered and fixed using an epoxy-based adhesive 11 to a predetermined position on an alumina substrate 2 having thereon a previously formed copper interconnection 6. A polyimide film 4 about 2 μm in thickness is formed on the surface of said alumina substrate 2 except for the portions corresponding to pads 5 on the semiconductor chip 1 and electrically conductive electrodes 6. An aluminum film 3 for wiring is formed at a thickness of 0.3 μm on the polyimide film 4 to electrically connect between the pads 5 and the copper.

Figure 6:
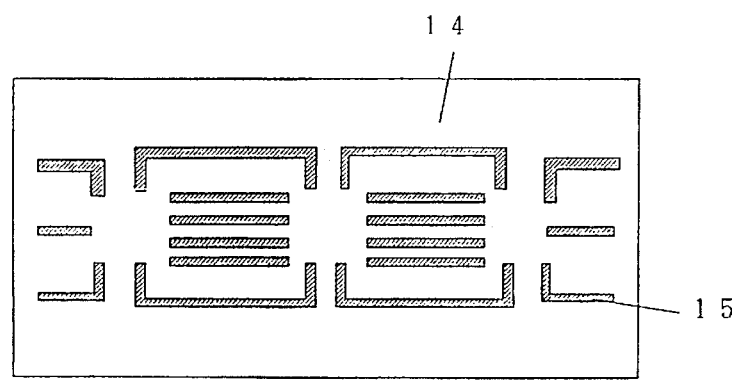
FIG. 6 is an upper view of a mask for use in the excimer laser according to the present invention.
Figure 7:
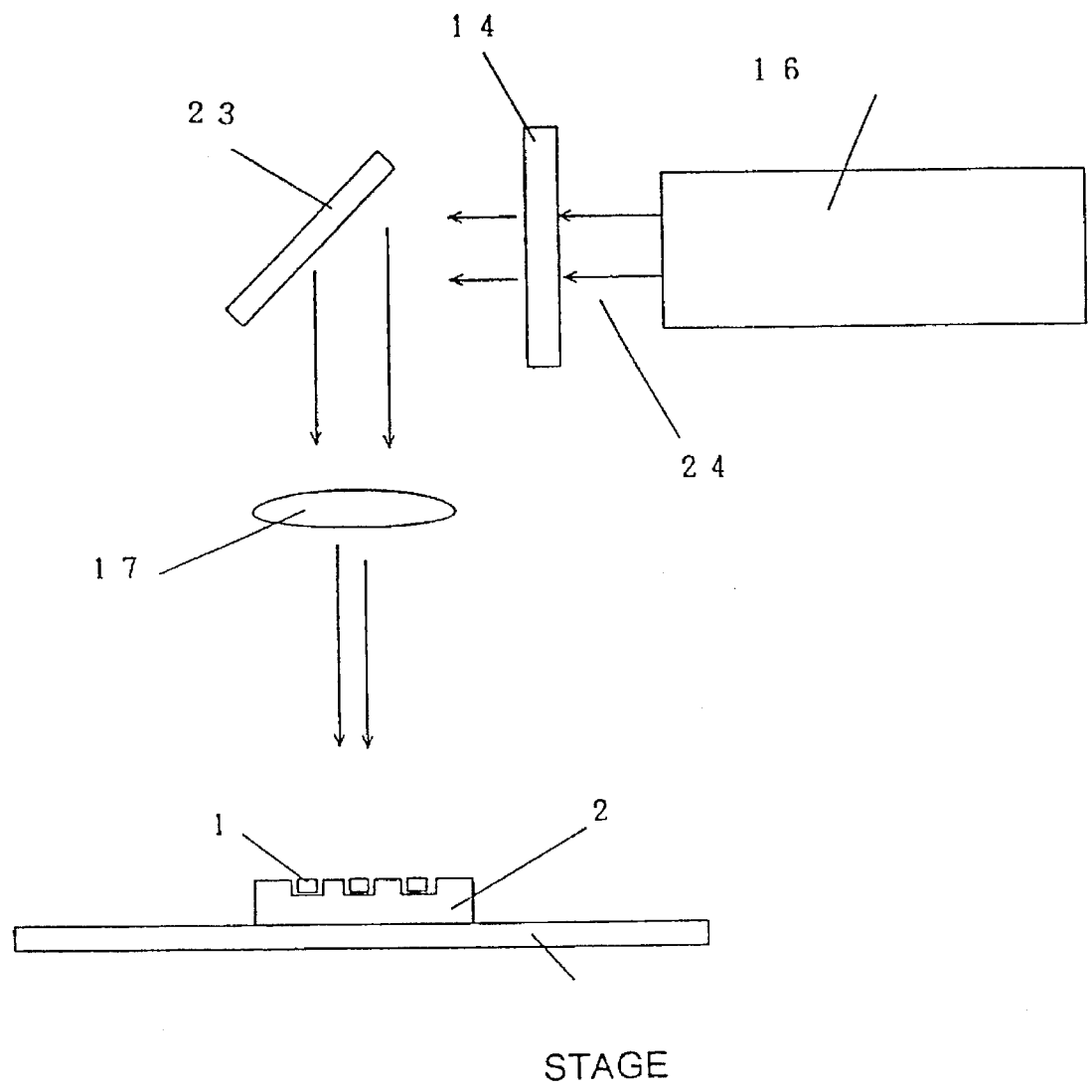
FIG. 7 is a scheme showing the irradiation state of an excimer laser according to the present invention.
Figure 8:
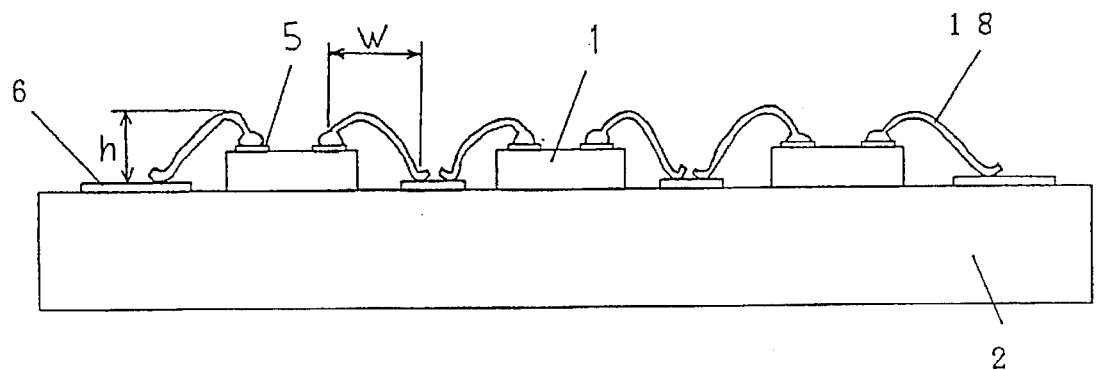
FIG. 8 is a cross section view of a prior art semiconductor device.
Figure 9:
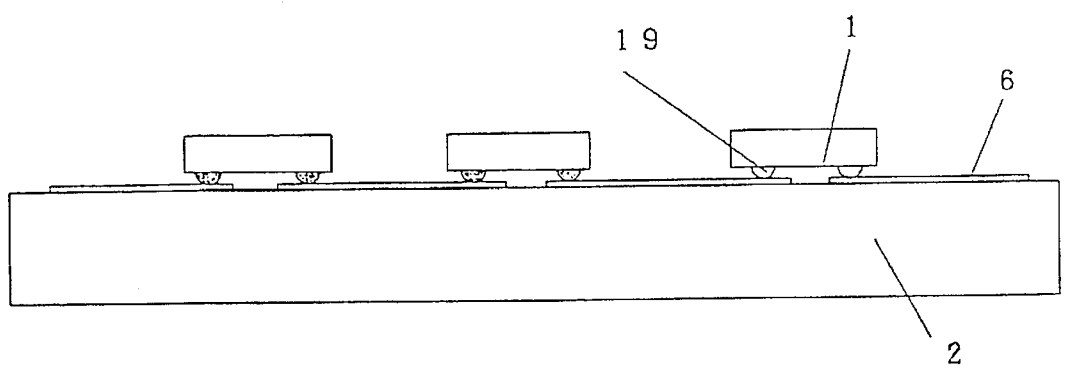
FIG. 9 is a cross section view of another prior art semiconductor device.
Figure 10:
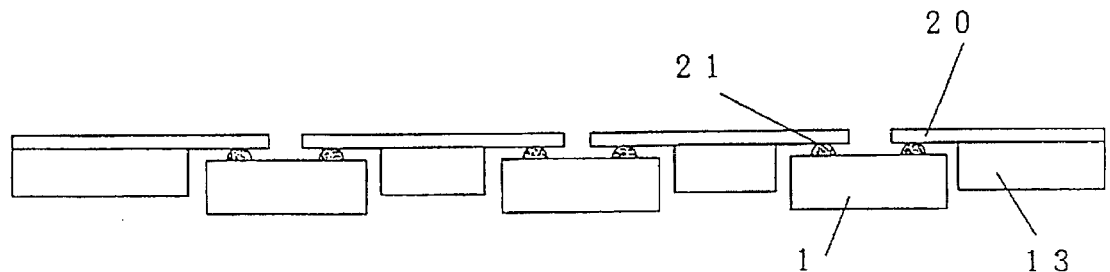
FIG. 10 is a cross section view of a yet other prior art semiconductor device.

The fabrication process of the present example is described below. First, a semiconductor chip 1 was adhered and fixed using an epoxy-based adhesive 11 to an alumina substrate 2 having thereon a previously formed copper interconnection. A polyimide film 4 was formed thereafter at a thickness of about 2 μm on the entire surface of said alumina substrate 2 by spray coating. The portions of the polyimide film 4 corresponding to the pads 5 on the semiconductor chip 1 and the copper wiring on the alumina substrate 2 were removed by irradiating a laser beam in 5 pulses using an excimer laser operated at an output energy of 300 mJ/cm$^2$ to perforate holes having an aperture of 0.05×0.05 mm in size. Subsequently, the resulting alumina substrate 2 was placed inside a vacuum chamber (not shown in the figure) of a sputtering apparatus, and after evacuating the inside of the vacuum chamber to have a pressure of about 1×10$^{-5}$ Torr, Ar gas was introduced therein to control the inner pressure to about 7×10$^{-3}$ Torr. Thereafter, an aluminum film as a target material was deposited at a thickness of about 0.3 μm by applying a sputtering power of about 500 W for a duration of 10 minutes. After forming the aluminum film, referring to FIG. 7, a laser beam 24 emitted from an excimer laser 16 (2 pulses; the laser was operated at 300 mJ/cm$^2$) was reduced to a half by transferring it through a mirror 23 and a lens 17, and was irradiated to the aluminum film using a mask for an excimer laser comprising an aluminum mask pattern 15 formed on a quartz glass 14 at a line width of about 0.04 mm as shown in FIG. 6. In this manner, the aluminum film was removed from portions to which the laser beam was irradiated after being transmitted through the mask having no mask pattern 15 thereon to leave over aluminum electrodes 3. Thus was obtained a semiconductor device comprising a plurality of semiconductor chips 1 electrically connected to one another.

Figure 3:
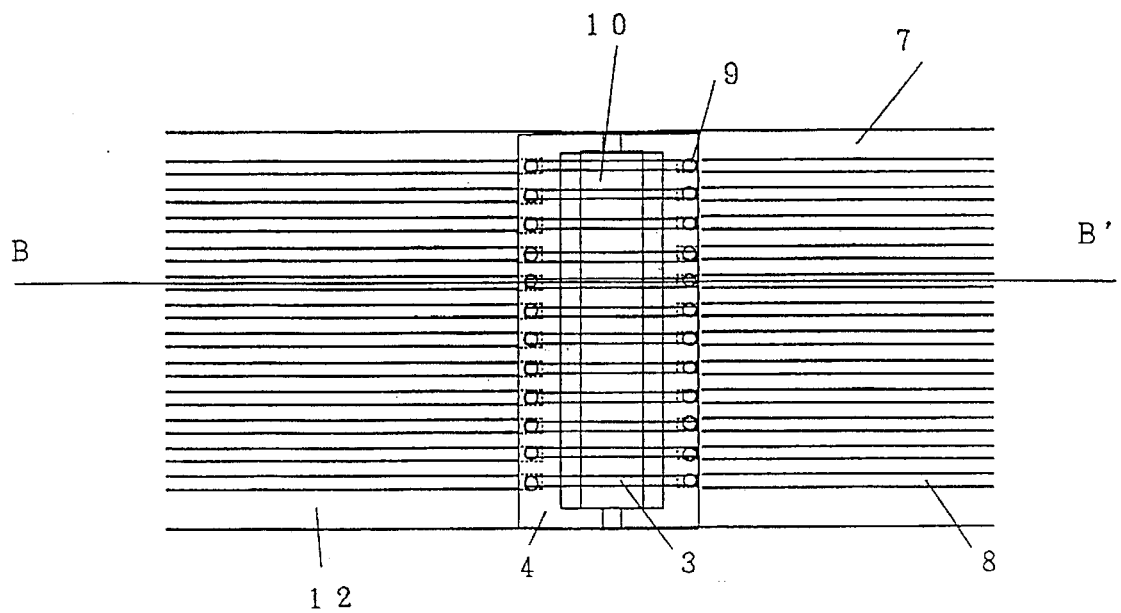
FIG. 3 is an enlarged upper view of the connecting portion of a semiconductor device according to the present invention.
Figure 4:
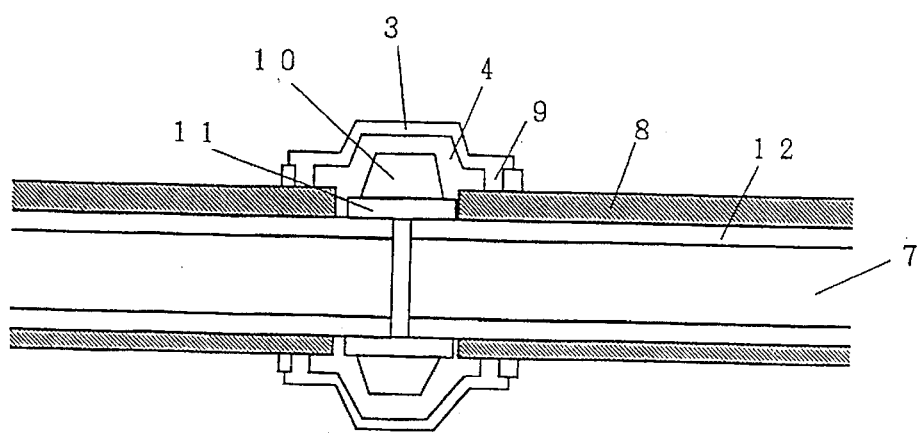
FIG. 4 is an enlarged cross section view along line B—B' of the connecting portion of a semiconductor device according to the present invention.

Another example according to the present invention is described below referring to FIG. 3 (an enlarged upper view of the connecting portion) and FIG. 4 (an enlarged cross section view along line B—B' of the connecting portion). Semiconductor elements 7 each comprising on both sides thereof a silicon oxide film 12 and an aluminum pattern 8 formed on the silicon oxide film 12. The aluminum pattern 8 comprises lines formed at a line width of 30 μm and spaced at a distance of 20 μm. The semiconductor elements were each 30 mm in outer width and 60 mm in outer length. Two such semiconductor elements 7 were mechanically joined by adhering glass joint chips 10 to the end portions thereof using an epoxy-based adhesive 11, provided that the glass joint chips 10 have each a trapezoidal cross section and that they were attached in such a manner that the wider plane may correspond to the side of the semiconductor element 7. This step was repeated 4 times to join five semiconductor elements.

Figure 11:
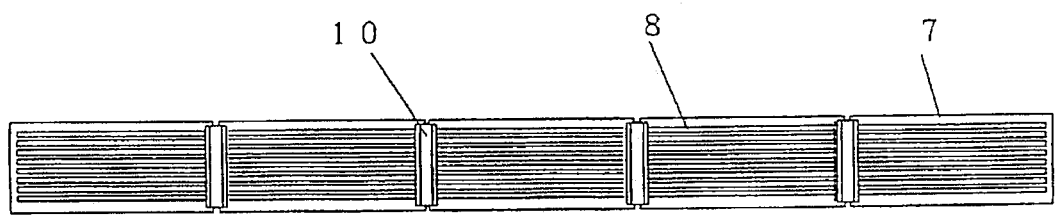
FIG. 11 is an upper view of a semiconductor device comprising five semiconductor elements being connected according to the present invention.

FIG. 11 shows the upper view of a complete semiconductor device obtained by joining five semiconductor elements.

After finishing the mechanical joining, the periphery of the joining portions of each of the semiconductor elements 7 was coated with a polyimide film 4 by spray coating, and holes each 0.015 mm in diameter were perforated using an excimer laser 16 at the portions corresponding to the aluminum pattern. After finishing the perforation of holes in the polyimide film 4, aluminum was deposited on the side inner than the polyimide film 4 to a thickness of 0.3 μm using a sputtering apparatus in the same manner as in the foregoing example. Then, the step of forming aluminum electrodes 3 each 0.02 mm in width was effected by removing the aluminum film from the unnecessary portions in the same manner as in the foregoing example, by irradiating laser beam in two pulses using an excimer laser at an output energy of 300 mJ/cm$^2$ through a quartz glass mask for excimer lasers (not shown in the figure) corresponding to the aluminum pattern 8. This step was repeated on both sides of four places to obtain a semiconductor device comprising a plurality of semiconductor elements being joined to about 300 mm in total length. In the present example, the glass joint chips 10 were used to increase the mechanical strength of the semiconductor device. However, the mechanical joining can be effected using, if necessary, an adhesive alone. Furthermore, the joining can be effected via the cross sections of the joining portions alone. Although glass joint chips 10 were used in the present example, silicon joint chips 10 obtained by processing silicon wafers into a trapezoidal shape by means of anisotropic etching using potassium hydroxide and the like may be used in the place thereof.

Figure 5:
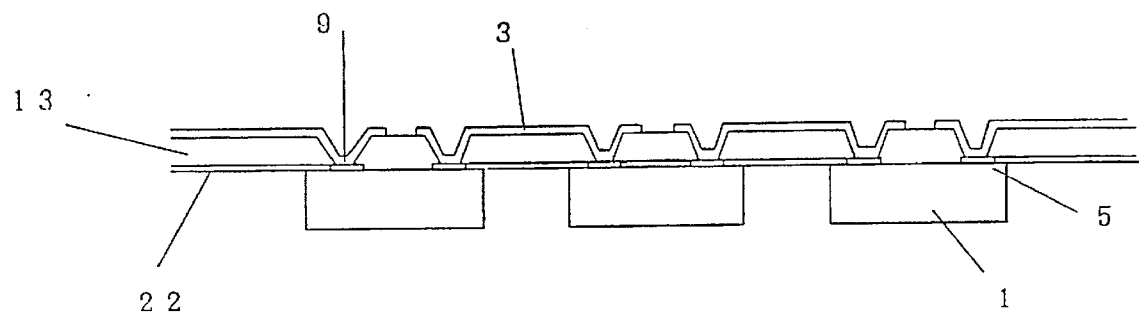
FIG. 5 is a cross section view of another semiconductor device according to the present invention.

Another example is described below with reference to FIG. 5 (cross section view). A semiconductor chip 1 was adhered and fixed on a polyimide film 13 having a thickness of 0.05 to 0.125 mm via an adhesive film 22 provided previously on the polyimide film 13. Upon completing adhesion, the polyimide film 13 and the adhesive film 22 provided at the position corresponding to the pads 5 on the semiconductor chip 1 were removed by irradiating laser beam in 20 pulses using an excimer laser operated at an output energy of 500 mJ/cm$^2$. In this manner, holes 9 were perforated at an aperture size of 0.05×0.05 mm. Subsequently, an aluminum film was deposited at a thickness of about 0.3 μm on the substrate by using a sputtering apparatus in the same manner in the foregoing example. Aluminum electrodes 3 each having 0.05 mm in width were formed by removing the aluminum film from the unnecessary portions using the laser beam emitted in two pulses from an excimer laser operated at an output energy of 300 mJ/cm$^2$ transmitted through the portions having no mask patterns thereon. A semiconductor device comprising the aluminum electrodes 3 formed with 0.05 mm in width and a plurality of semiconductor chips connected on the polyimide film was fabricated in this manner.

The description above was made specifically on an example comprising aluminum electrodes 3 spaced at a distance of 0.02 mm and having a minimum pattern width of 0.02 mm. However, the present fabrication process can be effectively applied to the formation of aluminum electrodes being spaced at a distance of 0.01 mm and having a pattern width of about 0.01 mm. It was also found that no defects such as a change in resistance value and disconnection occurred on the aluminum electrodes formed on the electric connecting portions in weathering tests performed under severe environments such as high temperature and extreme humidity conditions. Although aluminum electrodes were used for the electric connection, other electrode materials such as copper, nickel, and chromium can be used as well.

In the example of the present invention, the deposition of the film was conducted by sputtering. However, PVD apparatuses for use in vacuum deposition, ion plating, etc., or those used in plasma-assisted CVD as well as in photochemical vapor deposition can be used in the deposition of films.

The description above was made specifically to a case using an excimer laser for the processing. However, the same effects were obtained by using other processing methods, for example, a process employing laser apparatuses such as YAG laser and the like, or a process using an ion beam.

As described in the foregoing examples, the present invention enables a connection at a pitch width of 0.02 mm. This pitch width is extremely narrow as compared with any other achieved in the prior art processes, and it allows the fabrication of a compact and thin semiconductor device, because the area necessary for the connection can be reduced. Furthermore, since the process obviates the need of connecting wires one by one, the connection process consumes less time. This consequently enables the fabrication of semiconductor devices at a low cost. The present process also enables the fabrication of large area devices because it can be carried out without any limitations concerning the warping and deformation which affect the process in case of using solder bumps. Furthermore, since it is not required to produce leads, it is also possible to connect semiconductor elements comprising a considerable number of pads.

What is claimed is:

1. A process for fabricating a semiconductor device having a plurality of semiconductor chip elements, comprising the steps of:

placing and fixing a plurality of semiconductor chip elements in a desired manner;

forming an electrically conductive coating on at least connecting regions of the semiconductor chip elements; and forming interconnection lines by patterning the conductive coating using an excimer laser.

2. A process for fabricating a semiconductor device as claimed in claim 1, wherein the electrically conductive coating is formed by a thin-film deposition method selected from the group consisting of physical vapor deposition (PVD) and chemical vapor deposition (CVD).

3. A process for fabricating a semiconductor device as claimed in claim 1; wherein the electrically conductive coating is patterned using an excimer laser beam having two pulses at an output energy of 300 mJ/cm$^2$.

4. A process for fabricating a semiconductor device as claimed in claim 1; wherein the step of placing and fixing a plurality of semiconductor chip elements comprises the step of bonding the respective semiconductor chip elements to a substrate.

5. A process for fabricating a semiconductor device as claimed in claim 4; wherein the step of bonding is performed using an epoxy-based adhesive.

6. A process for fabricating a semiconductor device as claimed in claim 1; wherein the step of placing and fixing a plurality of semiconductor chip elements comprises the step of joining together respective ones of the semiconductor chip elements using a joint chip.

7. A process for fabricating a semiconductor device as claimed in claim 6; wherein the joint chip is formed of glass and has a trapezoidal cross-section.

8. A process for fabricating a semiconductor device as claimed in claim 6; wherein the joint chip is formed of silicon and has a trapezoidal cross-section.

9. A process for fabricating a semiconductor device as claimed in claim 1; further comprising the step of forming an insulating film on respective ones of the semiconductor chip elements on regions other than the connecting regions.

10. A process for fabricating a semiconductor device as claimed in claim 1; wherein the step of patterning the conductive coating is performed using an excimer laser beam emitted in two pulses at an output energy of 300 mJ/cm$^2$.

11. A process for fabricating a semiconductor device as claimed in claim 9; wherein the step of patterning the conductive coating is performed using a patterned mask.

12. A process for fabricating a semiconductor device as claimed in claim 1; further comprising the steps of forming an insulating film on the respective semiconductor chip elements and patterning the insulating film using an excimer laser to perforate holes so as to expose the connecting regions.

13. A process for fabricating a semiconductor device comprising the steps of:

bonding a plurality of semiconductor chip devices to a substrate;

forming a conductive thin film on the substrate to cover at least connecting regions of the semiconductor chip devices; and patterning the conductive thin film using an excimer laser to form interconnections between the respective semiconductor chip devices.

14. A process for fabricating a semiconductor device according to claim 13; wherein the conductive thin film is formed by a method selected from physical vapor deposition and chemical vapor deposition.

15. A process for fabricating a semiconductor device according to claim 13; wherein the step of bonding the semiconductor chip devices to a substrate is performed using an epoxy-based adhesive.

16. A process for fabricating a semiconductor device according to claim 13; further comprising the step of forming an insulating thin film on the substrate so as to cover the plurality of semiconductor chip devices except for the connection regions.

17. A process for fabricating a semiconductor device according to claim 16; wherein the thickness of the insulating thin film is approximately 2 microns.

18. A process for fabricating a semiconductor device according to claim 13; wherein the conductive thin film is formed of aluminum and has a thickness of approximately 0.3 microns.

19. A process for fabricating a semiconductor device according to claim 13; wherein the step of patterning the conductive thin film is performed using an excimer laser beam emitted in two pulses at an output energy of 300 mJ/cm$^2$.

20. A process for fabricating a semiconductor device according to claim 19; wherein the step of patterning the conductive thin film is performed using a patterned mask.

* * * * *